United States Patent
Ide et al.

(10) Patent No.: US 10,707,372 B2
(45) Date of Patent: Jul. 7, 2020

(54) LIGHT-EMITTING DEVICE

(71) Applicant: STANLEY ELECTRIC CO., LTD., Tokyo (JP)

(72) Inventors: Shunya Ide, Tokyo (JP); Ji-Hao Liang, Tokyo (JP); Kyotaro Koike, Tokyo (JP); Noriko Nihei, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/242,007

(22) Filed: Jan. 8, 2019

(65) Prior Publication Data
US 2019/0214528 A1 Jul. 11, 2019

(30) Foreign Application Priority Data

Jan. 9, 2018 (JP) ................. 2018-001196

(51) Int. Cl.
| | | |
|---|---|---|
| H01L 33/06 | (2010.01) | |
| H01L 33/38 | (2010.01) | |
| H01L 33/56 | (2010.01) | |
| H01L 33/48 | (2010.01) | |
| H01L 33/00 | (2010.01) | |
| H01L 33/54 | (2010.01) | |
| H01L 33/46 | (2010.01) | |

(52) U.S. Cl.
CPC .......... *H01L 33/06* (2013.01); *H01L 33/0095* (2013.01); *H01L 33/38* (2013.01); *H01L 33/483* (2013.01); *H01L 33/54* (2013.01); *H01L 33/56* (2013.01); *H01L 33/46* (2013.01)

(58) Field of Classification Search
CPC ...... H01L 33/385; H01L 33/405; H01L 33/54
See application file for complete search history.

(56) References Cited

U.S. PATENT DOCUMENTS

2017/0062671 A1* 3/2017 Hashimoto ............. H01L 33/54

FOREIGN PATENT DOCUMENTS

JP 2002-118293 A 4/2002

* cited by examiner

*Primary Examiner* — Daniel P Shook
(74) *Attorney, Agent, or Firm* — Xsensus LLP

(57) ABSTRACT

A light-emitting device in which a light-emitting element and a substrate are reliably bonded to each other and which has high operation stability is provided. The light-emitting device includes the substrate, the light-emitting element disposed on the substrate with a bonding layer interposed therebetween, and a resin body configured to surround and cover entire side surfaces of the light-emitting element, and have a bottom surface having any of a curved surface shape and a planar surface shape that faces the substrate and is configured to be distant from the substrate between the resin body and the substrate as a distance from the side surface of the light-emitting element increases.

21 Claims, 9 Drawing Sheets

LIGHT-EMITTING DEVICE

This application claims the priority benefit under 35 U.S.C. § 119 of Japanese Patent Application No. 2018-001196 filed on Jan. 9, 2018, which is hereby incorporated in its entirety by reference.

TECHNICAL FIELD

The presently disclosed subject matter relates to a light-emitting device including a light-emitting element such as a light-emitting diode.

BACKGROUND ART

A light-emitting device includes a substrate provided with terminals, wirings, and the like, and at least one light-emitting element mounted on the substrate. The light-emitting element is bonded to the substrate with a bonding material interposed therebetween, and sealed with a resin or the like. For example, Japanese Patent Application Laid-Open No. 2002-118293 discloses a light-emitting device including a light-emitting element having a semiconductor layer on a substrate, and a light-transmitting mold member having a fluorescent material and surrounding the surface of the light-emitting element.

In consideration of, for example, a case where the light-emitting device is used in a vehicular lamp, it is preferable that the light-emitting device operates stably even under various harsh environments. For example, it is preferable that the light-emitting element and the mounting substrate are reliably bonded to ensure sufficient mechanical strength of the entire device. Further, for example, it is preferable that the light-emitting element and the wiring on the substrate are reliably electrically connected with each other with certainty, and short-circuiting between the terminals, poor electric conduction, and the like are reliably prevented. Further, for example, in consideration of supplying adequate and sufficient light to a desired region, it is preferable that the light-emitting device has high light extraction efficiency and a capability of providing desired light distribution properties.

SUMMARY

The presently disclosed subject matter was devised in view of these and other problems and features in association with the conventional art. According to an aspect of the presently disclosed subject matter, a light-emitting device in which a light-emitting element and a substrate are reliably bonded to each other and which has high operation stability is provided.

According to another aspect of the presently disclosed subject matter, a light-emitting device includes a substrate, a light-emitting element disposed on the substrate with a bonding layer interposed therebetween, and a resin body configured to surround and cover entire side surfaces of the light-emitting element, and have a bottom surface having any of a curved surface shape and a planar surface shape that faces the substrate and is configured to be distant from the substrate between the resin body and the substrate as a distance from the side surface of the light-emitting element increases.

The light-emitting device with the aforementioned configuration may further include a reflective film disposed on an outer peripheral side surface of the resin body. Herein, the reflective film may preferably be disposed on at least part of the bottom surface of the resin body.

In the light-emitting device with the aforementioned configuration, the bonding layer may include a first metal layer serving as a cathode electrode for the light-emitting element and a second metal layer serving as an anode electrode for the light-emitting element, the reflective film may be formed of a metal film and disposed on an outer peripheral side surface and the bottom surface of the resin body, and the reflective film may be connected to the first metal layer in between the substrate and the light-emitting element.

In the light-emitting device with the aforementioned, configuration, the resin body may be formed of a resin material having a reflectivity with respect to light emitted from the light-emitting element.

The light-emitting device with the aforementioned configuration may further include a light-transmitting plate that contains a fluorescent material and is disposed over the light-emitting element, the resin body surrounding and covering also a side surface of the light-transmitting plate.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to light-emitting devices according to the presently disclosed subject matter}

First Exemplary Embodiment

Figure 1A:
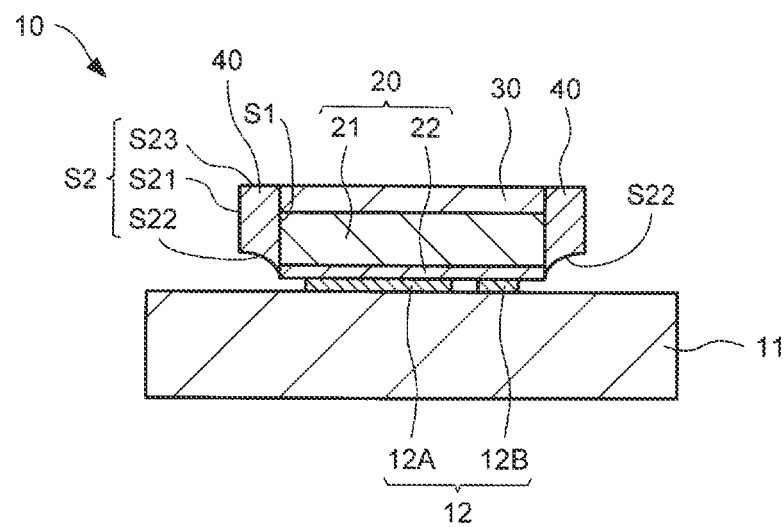
FIG. 1A is a cross-sectional view illustrating a light-emitting device according to a first exemplary embodiment made in accordance with principles of the presently disclosed subject matter.
Figure 1B:
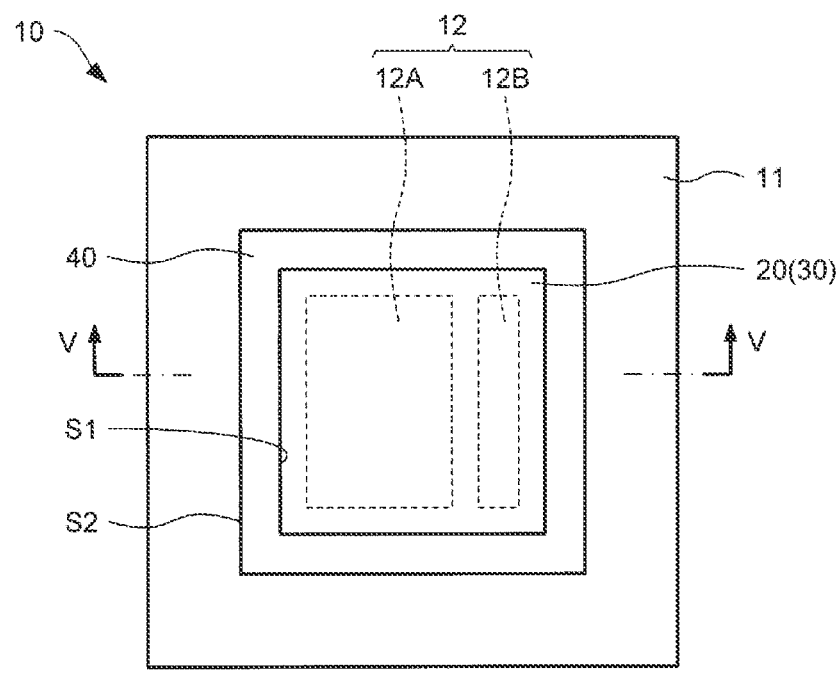
FIG. 1B is a schematic top view illustrating the light-emitting device according to the first exemplary embodiment.

FIG. 1A is a cross-sectional view illustrating a light-emitting device 10 according to a first exemplary embodiment. FIG. 1B is a schematic top view illustrating the light-emitting device 10. FIG. 1A is a cross-sectional view taken along line V-V of FIG. 1B. A configuration of the light-emitting device 10 will be described with reference to FIGS. 1A and 1B. The light-emitting device 10 includes a mounting substrate (which may also be referred to simply as a "substrate" or as a "first substrate") 11, a light-emitting element 20 mounted on the mounting substrate 11, and a light-transmitting plate 30 disposed on the light-emitting element 20.

The mounting substrate 11 has, for example, a substantially flat mounting surface on which a metal wiring (not illustrated) for supplying power to the light-emitting element 20 is provided. The light-emitting element 20 is fixed on the mounting surface of the mounting substrate 11. In the present exemplary embodiment, the light-emitting device 10 includes a bonding layer 12 provided between the mounting substrate 11 and the light-emitting element 20 to bond the mounting substrate 11 and the light-emitting element 20 to each other. That is, the light-emitting element 20 is disposed on the mounting substrate 11 with the bonding layer 12 interposed therebetween.

The light-emitting element 20 is, for example, a semiconductor light-emitting element such as a light-emitting diode. The light-emitting element 20 includes, for example, a support substrate 21 (which may also be referred to as a "second substrate") and an optical semiconductor layer 22 supported on the support substrate 21. Although not illustrated, the optical semiconductor layer 22 has a structure in which, for example, an n-type semiconductor layer (which may also be referred to as a "first semiconductor layer"), an active layer (which may also be referred to as a "light-emitting layer"), and a p-type semiconductor layer (which may also be referred to as a "second semiconductor layer") are slacked.

In this exemplary embodiment, the light-emitting element 20 is bonded to the mounting substrate 11 from the side of the optical semiconductor layer 22. That is, the light-emitting element 20 is mounted on the mounting substrate 11 by flip-chip mounting. Therefore, in this exemplary embodiment, the optical semiconductor layer 22 is disposed on the mourning substrate 11, and the support substrate 21 is disposed on the optical semiconductor layer 22. The support substrate 21 has a light-transmitting property with respect to the light emitted from the optical semiconductor layer 22. For example, the support substrate 21 is a substrate used when crystal growth of the optical semiconductor layer 22 is performed, and is formed of, for example, a sapphire substrate.

The light-transmitting plate 30 is bonded to the light-emitting element 20 (in this exemplary embodiment, on the surface of the support substrate 21 opposite to the optical semiconductor layer 22) via an adhesive layer (not illustrated). The light-transmitting plate 30 has a light-transmitting property with respect to the light emitted from the optical semiconductor layer 22. The light-transmitting plate 30 is formed of, for example, a flat glass plate. Therefore, in this exemplary embodiment, the light emitted from the optical semiconductor layer 22 is taken out to the outside through the support substrate 21 and the light-transmitting plate 30. That is, in the light-emitting device 10, the upper surface of the transmitting plate 30 functions as a light extraction surface.

As shown in FIG. 1B, in this exemplary embodiment, the support substrate 21 and the optical semiconductor layer 22 of the light-emitting element 20 each have a rectangular upper surface shape. Further, in this exemplary embodiment, the light-transmitting plate 30 has a rectangular upper surface shape substantially the same as that of the support substrate 21 of the light-emitting element 20.

The light-transmitting plate 30 may include a fluorescent material. For example, the light-transmitting plate 30 may be a resin plate containing fluorescent material particles, or may be a single crystal fluorescent material plate. For example, in this exemplary embodiment, the light-emitting element 20 has the optical semiconductor layer 22 formed of a nitride-based semiconductor having a peak wavelength in the blue region, and the light-transmitting plate 30 is a fluorescent material plate having a YAG fluorescent material. Therefore, in this exemplary embodiment, the light-emitting device 10 emits white light to the outside.

In this exemplary embodiment, the bonding layer 12 is formed of a metal layer. Specifically, as illustrated in FIGS. 1A and 1B, the bonding layer 12 includes a first metal layer 12A formed of a metal material and a second metal layer 12B formed of a metal material and insulated from the first metal layer 12A. For example, the first and second metal layers 12A and 12B are formed of metal layers separated from each other with a gap and disposed in between the mounting substrate 11 and the optical semiconductor layer 22 of the light-emitting element 20. For example, each of the first and second metal layers 12A and 12B is formed of an Au layer or an AuSn layer.

In this exemplary embodiment, the first metal layer 12A functions as a cathode electrode (which may also be referred to as a "first electrode layer") connected to the n-type semiconductor layer of the optical semiconductor layer 22 in the light-emitting element 20. The second metal layer 12B functions as an anode electrode (which may also be referred to as a "second electrode layer") connected to the p-type semiconductor layer of the optical semiconductor layer 22. The first and second metal layers 12A and 12B of the bonding layer 12 are connected to a cathode terminal and an anode terminal (which are not illustrated), respectively on the mounting substrate 11.

The light-emitting device 10 includes a resin body 40 that surrounds and covers the side surfaces of the light-emitting element 20 and the light-transmitting plate 30. In this exemplary embodiment, the resin body 40 is formed of a resin having reflectivity with respect to light emitted from the light-emitting element 20, and for example, formed of a white resin. Therefore, most of the light emitted from the light-emitting element 20 is reflected by the resin body 40 toward the fight-transmitting plate 30. Accordingly, the provision of the resin body 40 can improve the light extraction efficiency of the light-emitting device 10. Examples of the white resin used herein may include a two-liquid type rubber commercially available as "KER-2938-A/B" from Shin-Etsu Chemical Co., Ltd., and a white resin in which titanium oxide or the like white colorant is mixed and dispersed in a transparent silicone resin.

In this exemplary embodiment, the resin body 40 may be a resin film which completely surrounds and covers the side surfaces of the light-emitting element 20 and the light-transmitting plate 30 and forms a closed band form. The resin body 40 is configured to be in close contact with the side surfaces of the light-emitting element 20 and the side surfaces of the light-transmitting plate 30. As shown in FIGS. 1A and 1B, in this exemplary embodiment, the resin body 40 has an element contact surface S1 which is in contact with the light-emitting element 20 and the light-transmitting plate 30, and an outer exposed surface S2 exposed to the outside (for example, in an external atmosphere).

As shown in FIG. 1A, in this exemplary embodiment, the element contact surface S1 of the resin body 40 forms an inner peripheral side surface of the resin body 40. In this exemplary embodiment, the resin body 40 covers only the side sur faces of the light-emitting element 20 and the light-transmitting plate 30, and the element contact surface S1 is in contact only with the side surfaces of the light-emitting element 20 and the light-transmitting plate 30.

In this exemplary embodiment, the outer exposed surface S2 of the resin body 40 is composed of a side surface S21 forming an outer peripheral side surface of the resin body 40, a bottom surface S22 forming a bottom end surface (outer peripheral end surface on the side of the mounting substrate 11) of the resin body 40 facing the mounting substrate 11, and an upper surface S23 forming a top end surface (outer peripheral end surface on the side opposite to the bottom end surface) of the resin body 40. The bottom surface S22 of the outer exposed surface S2 has a concave shape in which the distance from the mounting substrate 11 increases as the distance increases from the element contact surface S1, i.e., the side surface of the light-emitting element 20. In this exemplary embodiment, the entire bottom surface S22 is formed as a concave surface.

Figure 2A:
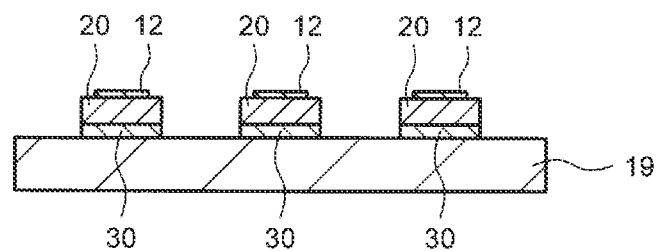
FIGS. 2A, 2B, 2C, and 2D are each a cross-sectional view illustrating a method for manufacturing a light-emitting device according to the first exemplary embodiment.
Figure 2B:
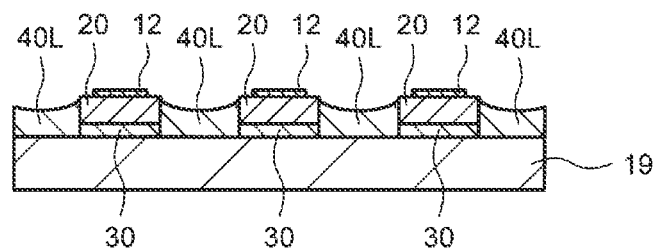
Figure 2C:
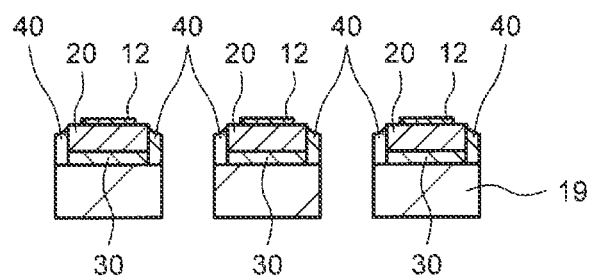
Figure 2D:
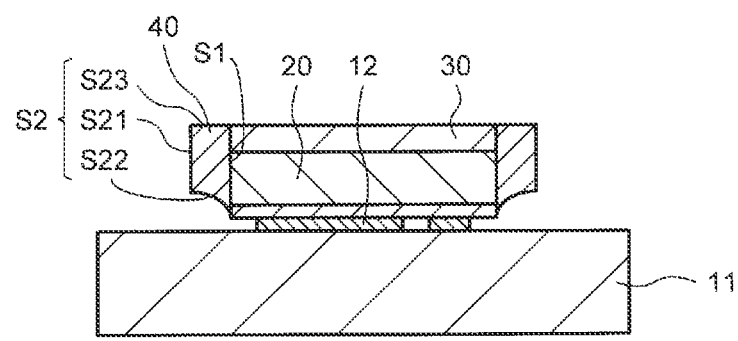

Next, the method for manufacturing the light-emitting device 10 will be described with reference to FIGS. 2A to 2D. FIG. 2A is a cross-sectional view illustrating a temporary substrate 19 on which the light-emitting elements 20 each with the light-transmitting plate 30 and the bonding layer 12 formed thereon are juxtaposed. FIG. 2B is a cross-sectional view illustrating the temporary substrate 19 coated with a thermosetting resin 40L. FIG. 2C is a cross-sectional view illustrating the temporary substrate 19 obtained by cutting between adjacent light-emitting elements 20. FIG. 2D is a cross-sectional view illustrating the light-emitting element 20 bonded to the mounting substrate 11.

First, a semiconductor film serving as the optical semiconductor layer 22 is epitaxially grown on a sapphire substrate serving as the support substrate 21. Next, a metal film serving as the bonding layer 12 is formed on the semiconductor film, and the sapphire substrate and the semiconductor film are cut to form a plurality of light-emitting elements 20. Then, a plurality of light-transmitting plates 30 are arranged on the temporary substrate 19 so as to be separated from each other and juxtaposed, and the light-emitting elements 20 are placed and bonded onto the light-transmitting plates 30 from the support substrate 21 side (see FIG. 2A).

Next, the thermosetting resin 40L is applied onto the surface of the temporary substrate 19 not covered with the light-emitting element 20 and thus exposed. At this time, the application amount of the thermosetting resin 40L is adjusted so that the thermosetting resin 40L does not reach the upper surface of the light-emitting element 20 and the bonding layer 12, and so that the entire side surfaces of the light-emitting element 20 are covered only by the surface tension. Subsequently, the temporary substrate 19 is heated to core the thermosetting resin 40L, whereby the thermosetting resin 40L is cured in a state in which concave portions (concave surfaces) are formed between the adjacent light-emitting elements 20 (see FIG. 2B).

Subsequently, the temporary substrate 19 is cut in a predetermined region so that the region includes each of the light-emitting elements 20. As a result, the thermosetting resin 40L remaining after cutting becomes the resin body 40 (see FIG. 2C). Next, a mounting substrate 11 is prepared separately from the temporary substrate 19. Then, the light-emitting element 20 is disposed on the mounting substrate 11 from the bonding layer 12 side. Then, by heating the mounting substrate 11, the bonding layer 12 is melted, so that the light-emitting element 20 is bonded to the mounting substrate 11 (see FIG. 2D). As illustrated by way of example, the light-emitting device 10 can be manufactured in this manner.

A description will next be given of the resin body 40 and its bottom surface S22 (concave surface). As described above, when the light-emitting element 20 is bonded to the mounting substrate 11, not only the mounting substrate 11 and the light-emitting element 20 but also the resin body 40 is heated. In this exemplary embodiment, the resin body 40 is formed of a resin having a thermal expansion coefficient higher than that of the light-emitting element 20, i.e., than those of the support substrate 21 and the optical semiconductor layer 22. Therefore, the resin body 40 has a larger volume increase than that of the light-emitting element 20 at the time of heating. In particular, the resin body 40 undergoes a large shape change (expansion) so that the outer exposed surface S2 opened to the outside expands.

Figure 3A:
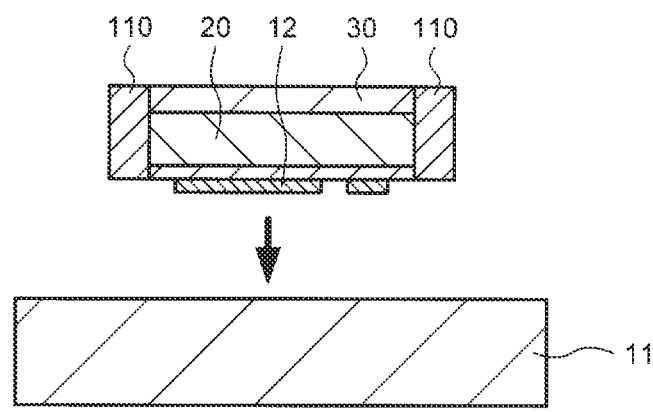
FIGS. 3A and 3B are each a cross-sectional view illustrating a method for manufacturing a light-emitting device according to a comparative example.
Figure 3B:
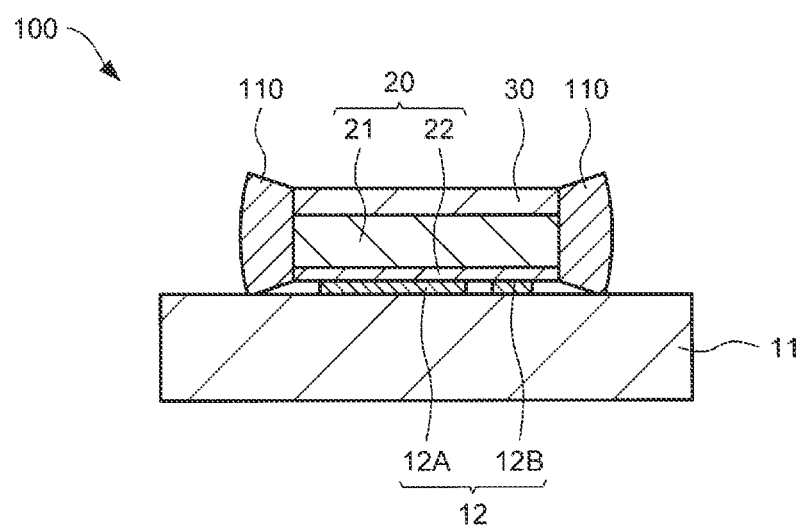

The inventors of the present invention have found that the thermal expansion of the resin body 40 may cause a bonding future of the light-emitting element 20 to the mounting substrate 11, and that the bonding failure can be prevented by the bottom surface S22 of the resin body 40 exposed on the mounting substrate 11 side having a concave shape. With reference to FIGS. 3A and 3B, a description will next be given of a bonding failure which may occur when the resin body has a bottom surface having a uniform distance from the mounting substrate 11 as a comparative example according to a conventional art.

FIG. 3A is a cross-sectional view illustrating, as a comparative example, a light-emitting element 20 in which a resin body 110 having a bottom surface in a planar shape having the same height as the surface of the light-emitting element 20 on the mounting substrate 11 side is formed, and a mounting substrate 11 before the light-emitting element 20 is bonded. FIG. 3B is a cross-sectional view illustrating a light-emitting device 100 according to the comparative example.

First, as illustrated in FIG. 3A, when the resin body 110 is formed on the side surfaces of the light-emitting element 20 for the purpose of for example, improving the light extraction efficiency and capability of providing desired light distribution properties (such as properties of suppressing leakage of light from periphery of the element to increase contrast between the light extraction surface and surrounding portions), the resin body 110 need only be formed on the side surfaces of the light-emitting element 20, and the necessity of considering the entire shape of the resin body 110 is low. Therefore, it is assumed that the side surfaces of the light-emitting element 20 are surrounded and covered with the resin body 110 that has a certain constant thickness. In this case, the bottom surface of the resin body 110 has a flat shape as illustrated in FIG. 3A, or has a convex shape with a small distance mom the mounting substrate 11.

The resin body 110 having such a shape also expands in a heating step when it is bonded to the mounting substrate 11. The bottom surface of the resin body 110 exposed to the mounting substrate 11 side also expands in the direction toward the mounting substrate 11. In general, a resin material used for the resin body 110 has a higher coefficient of thermal expansion than those of the metal material used for the bonding layer 12 and the semiconductor material used for the light-emitting element 20. Therefore, as illustrated in FIG. 3B, even if the resin body 110 is separated from the mounting substrate 11 before heating, the resin body 110 may touch the mounting substrate 11 during heating.

In this case, the expanded resin body 110 may cause the bonding layer 12 to float (be separated) from the mounting substrate 11. Therefore, the bonding layer 12 may not be in close contact with the mounting substrate 11 sufficiently, and the light-emitting element 20, so that the mounting substrate 11 may not be bonded to each other with sufficient bonding strength.

The inventors of the present invention have focused on the possibility of this problem. In order to prevent this bonding failure, the inventors of the present invention have examined forming a relief on the bottom surface S22, which is a portion where the resin body 40 and the mounting substrate 11 may come into contact with each other during heating, for example, as illustrated in in FIG. 2C or FIG. 2D. That is, the inventors of the present invention have found that the above-described problem is solved by securing a certain large distance between the bottom surface S22 of the resin body 40, which is an exposed expansion portion, and the mounting substrate 11.

As a result, even when the resin body 40 expands during heating, contact between the resin body 40 and the mounting substrate 11 is suppressed, so that the light-emitting element 20 is reliably bonded to the mounting substrate 11. Therefore, in the light-emitting device 10 having such a resin body 40, the light-emitting element 20 and the mounting substrate 11 are reliably bonded to each other, and the light-emitting element 20 is reliably electrically connected to the mounting substrate 11. Accordingly, it is possible to provide the light-emitting device 10 in which the light-emitting element 20 and the mounting substrate 11 are reliably bonded to each other, and which has high operation stability and light extraction efficiency.

In this exemplary embodiment, the case where the resin body 40 is formed of a white resin has been described, but the resin body 40 may be formed of another resin material. For example, the resin body 40 may be formed of a resin material having a light-transmitting property with respect to light emitted from the light-emitting element 20. The resin body 40 can protect the light-emitting element 20, for example, the optical semiconductor layer 22 of the light-emitting element 20 by covering the side surfaces of the light-emitting element 20. Therefore, the resin body 40 may be formed of not only a light-reflective resin material but also a light-transmissive resin material.

In this exemplary embodiment, the case where the resin body 40 is formed of a white resin and completely covers the side surfaces of the light-emitting element 20 and the light-transmitting plate 30 has been described. As a result, the light-emitting device 10 has a configuration suitable for, for example, an application in which it is required that the difference in brightness at the boundary between the light-emitting portion and the non-light emitting portion should become clear (to have high contrast therebetween). However, the resin body 40 may be configured to cover an appropriate range of the side surfaces of the light-emitting element 20 and the light-transmitting plate 30 depending on, for example, the use and purpose of the light-emitting device 10.

In this exemplary embodiment, the case where the outer exposed surface S2 of the resin body 40 has the side surface S21, the bottom surface S22, and the upper surface S23 has been described, but the configuration of the resin body 40 is not limited to this. The resin body 40 may be configured to have other shapes as long as the resin body 40 has the concave bottom surface S22. For example, the side surface S21 and the upper surface S23 may have a concave shape, a convex shape, or an irregular surface. Further, the side surface S22 and the upper surface S23 may not be clearly distinguished from each other, and the upper surface S2 may be formed continuously from the side surface S22.

In this exemplary embodiment, the case where the resin body 40 has the concave bottom surface S22 has been described. However, the bottom surface S22 may be configured to have other shapes as long as the bottom surface S22 has a surface shape such that the distance from the mounting substrate 11 increases as the distance increases from the element contact surface S1 (i.e., the side surface of the light-emitting element 20).

Figure 4:
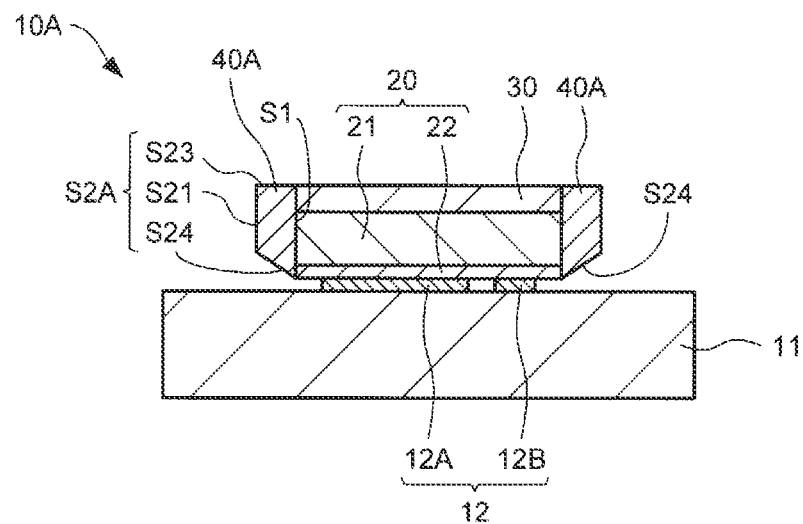
FIG. 4 is a cross-sectional view illustrating a light-emitting device according to a first modification of the first exemplary embodiment.

A description will next be given of several modifications. FIG. 4 is a cross-sectional view illustrating a light-emitting device 10A according to a first modification of the first exemplary embodiment. The light-emitting device 10A has the same configuration as that of the light-emitting device 10 except for the configuration of a resin body 40A. In the light-emitting device 10A, the resin body 40A has an element contact surface S1 that is in contact with the side surfaces of the light-emitting element 20 and the light-transmitting plate 30, and an outer exposed surface S2A exposed to the outside.

The outer exposed surface S2A of the resin body 40A has side surfaces S21 and upper surfaces S23 similar to those of the outer exposed surface S2 of the resin body 40. On the other hand, the outer surface S2A of the resin body 40A has a planar bottom surface S24 instead of the bottom surface S21 of the resin body 40. In the present modification, the bottom surface S24 of the resin body 40A is a tapered surface that tapers toward the mounting substrate 11.

Also, in the present modification, the resin body 40A has the bottom surface S24 that faces the mounting substrate 11 and increases in distance from the mounting substrate 11 as the distance increases from the side surface of the light-emitting element 20. Therefore, the light-emitting element 20 and the mounting substrate 11 can be reliably bonded to each other, and the light-emitting device 10A having high operation stability can be provided.

In this exemplary embodiment, the light-emitting device 10 has the light-transmitting plate 30. However, the light-emitting device 10 may not include the light-transmitting plate 30. The light-transmitting plate 30 is provided depending on the use and purpose of the light-emitting device 10 as necessary, and can have an arbitrary form. For example, the light-transmitting plate 30 may not include a fluorescent material. Further, the light-transmitting plate 30 may have a function as a protective film for suppressing element deterioration due to humidity.

The light-transmitting plate 30 may include, for example, a light scattering material. As a result, the electrode pattern formed on the light-emitting element 20 can be concealed to be difficult to be visually recognized from the outside. The light-transmitting plate 30 may have, for example, a curved upper surface. As a result, the light-transmitting plate 30 can have a lens function.

Figure 5:
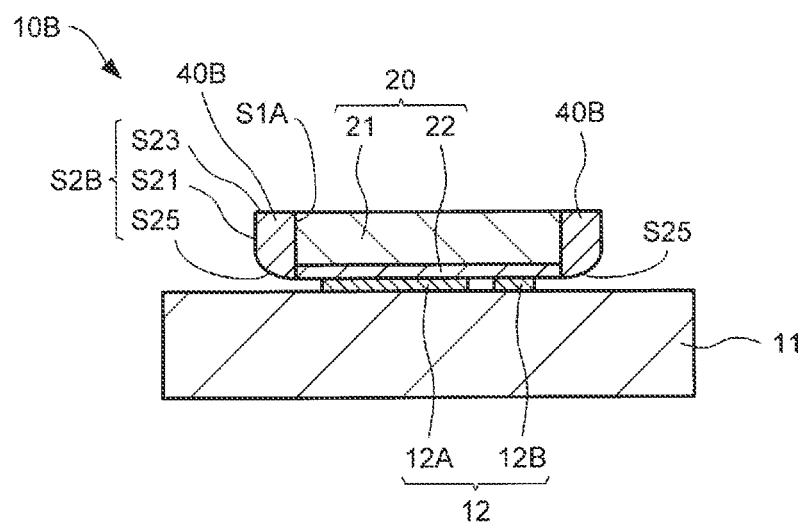
FIG. 5 is a cross-sectional view illustrating a light-emitting device according to a second modification of the first exemplary embodiment.

The bottom surface S22 of the resin body 40 may have another surface shape. FIG. 5 is a cross-sectional view illustrating a light-emitting device 10B according to a second modification of the first exemplary embodiment. The light-emitting device 10B has the same configuration as that of the light-emitting device 10 except that the light-transmitting plate 30 is not provided and the resin body 40B has a different configuration from that of the light-emitting device 10.

In the present modification, the upper surface of the support substrate 21 in the light-emitting element 20 functions as a light extraction surface. In addition, the resin body 40B has an element contact surface S1A that surrounds and covers only the light-emitting element 20 and is in contact only with the side surfaces of the light-emitting element 20.

The resin body 40B has an outer exposed surface S2B exposed to the outside, and the outer exposed surface S2 has a convex bottom surface S22. In the present modification, the resin body 40B has a convex bottom surface S25 that faces the mounting substrate 11 and increases in distance from the mounting substrate 11 as a distance increases from the side surface of the light-emitting element 20. Even when the resin body 40B has the convex bottom surface S25, the resin body 40B only need to be separated from the mounting substrate 11 toward the outside from the element contact surface S1A.

That is, as shown in the resin bodies 40, 40A, and 40B, the bottom surface S22, S24, or S25 having a curved surface shape or a planar shape, which increases in distance from the mounting substrate 11 as the distance increases from the side surface of the light-emitting element 20, only need to be provided. As a result, the light-emitting element 20 and the mounting substrate 11 are reliably bonded to each other, and the light-emitting devices 10, 10A, and 10B having high operation stability can be provided.

Figure 6:
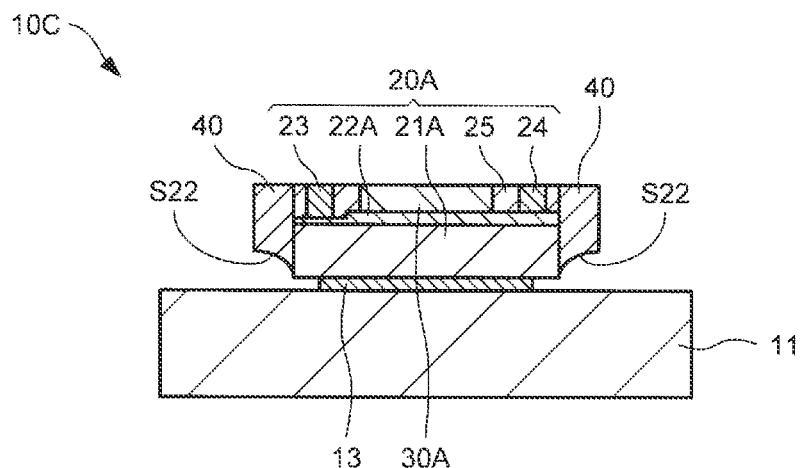
FIG. 6 is a cross-sectional view illustrating a light-emitting device according to a third modification of the first exemplary embodiment.

In this exemplary embodiment, the case where the bonding layer 12 is formed of a metal layer and functions as an electrode for supplying power to the light-emitting element 20 has been described. However, the configuration of the bonding layer 12 is not limited to this. FIG. 6 is a cross-sectional view illustrating a light-emitting device 10C according to a third modification of the first exemplary embodiment. The light-emitting device 10C has the same configuration as that of the light-emitting device 10 except for the configuration of the bonding layer 13, the light-emitting element 20A, and the light-transmitting plate 30A.

In the present modification, the bonding layer 13 is a resin layer formed of a resin material. The light-emitting element 20A includes a support substrate 21A formed on the bonding layer 13 and an optical semiconductor layer 22A formed on the support substrate 21A. That is, the light-emitting element 20A has a structure in which the light-emitting element 20A is bonded to the mounting substrate 11 from the support substrate 21A side.

In the present modification, the light-emitting element 20A has an n-side electrode (cathode electrode) 23 connected to the n-type semiconductor layer of the optical semiconductor layer 22A and a p-side electrode (anode electrode) 24 connected to the p-type semiconductor layer, which are formed on the optical semiconductor layer 22A. The light-emitting element 20 also has an insulating layer 25 that covers the upper surface of the optical semiconductor layer 22A and the side surfaces of the n-side electrode 23 and the p-side electrode 24, and that has an opening on a part of the upper surface of the optical semiconductor layer 22A. The light-transmitting plate 30 is formed in the opening of the insulating layer 25 in the light-emitting element 20A.

In the present modification, the n-side electrode 23 and the p-side electrode 24 are exposed from the insulating layer 25, and are connected to the wiring of the mounting substrate 11 via, for example, bonding wires. That is, this modification corresponds to the case where the bonding layer 13 does not serve as an electrode for the light-emitting element 20A and thus the light-emitting element 20A is supplied with power without passing through the bonding layer 13.

Also, in the present modification, the light-emitting device 10C includes the resin body 40 that surrounds and covers the side surfaces of the light-emitting element 20A. The resin body 40 has a concave bottom surface S22 facing the mounting substrate 11. Therefore, the light-emitting element 20A and the mounting substrate 11 can be reliably bonded to each other, and the light-emitting device 10C having high operation stability can be provided.

Figure 7:
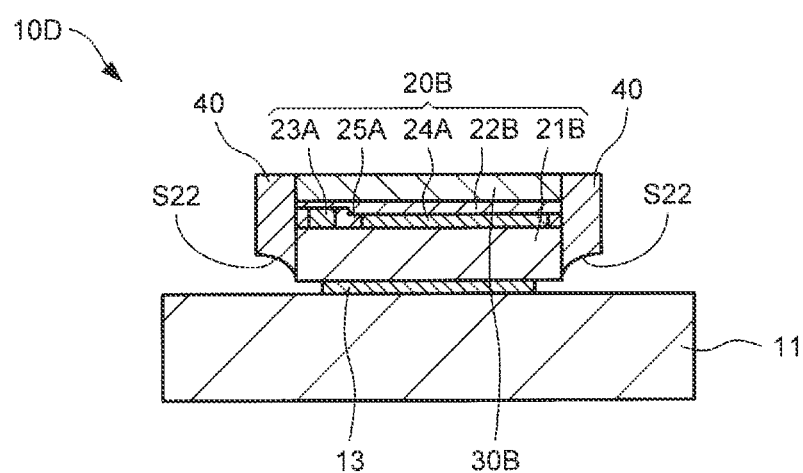
FIG. 7 is a cross-sectional view illustrating a light-emitting device according to a fourth modification of the first exemplary embodiment.

FIG. 7 is a cross-sectional view illustrating a light-emitting device 10D according to a fourth modification of the first exemplary embodiment. The light-emitting device 10D has the same configuration as that of the light-emitting device 10C except for the configuration of the light-emitting element 20B. In the light-emitting device 10D, the light-emitting element 20B includes a support substrate 21B formed on the bonding layer 13, an n-side electrode 23A, a p-side electrode 24A, and an insulating layer 25A which are formed on the support substrate 21B. The light-emitting element 20B includes an optical semiconductor layer 22B formed on the n-side electrode 23A, the p-side electrode 24A, and the insulating layer 25A.

In the present modification, the n-side electrode 23A and the p-side electrode 24A are formed between the support substrate 21B and the optical semiconductor layer 22B. In the present modification, the support substrate 21B is formed of a substrate different from the substrate used for crystal growth of the optical semiconductor layer 22B. The light-emitting element 20B can be manufactured by forming the optical semiconductor layer 22B and the electrodes on the substrate for crystal growth and then attaching the optical semiconductor layer 22B to another substrate to become the support substrate 21B.

In the present modification, the light-transmitting plate 30B is formed on the entire surface of the optical semiconductor layer 22B of the light-emitting element 20B. Also, in this modification, the light-emitting device 10D includes the resin body 40 that surrounds and covers the side surfaces of the light-emitting element 20B and the light-transmitting plate 30B and has a concave bottom surface S22.

Even when the light-emitting element 20B and the light-transmitting plate 30B are formed as in the light-emitting device 10D, the provision of the resin body 40 can provide high operational stability while bonding failure is suppressed, for example, similarly to the light-emitting element 20C.

Thus, in this exemplary embodiment and its modifications, for example, the light-emitting device 10, 10A or 10B has the mounting substrate (substrate) 11, the light-emitting element 20 disposed on the mounting substrate 11 through the bonding layer 12 or 13, and the resin body 40, 40A or 40B having a curved or planar bottom surface S22, S24 or S25 that surrounds and covers the side surfaces of the light-emitting element 20 and increases in distance from the mounting substrate 11 as it leaves the side surface of the light-emitting element 20 while facing the mounting substrate 11. Therefore, it is possible to provide a light-emitting device in which the light-emitting element 20 and the mounting substrate 11 are reliably bonded to each other and which has high operation stability.

Second Exemplary Embodiment

Figure 8A:
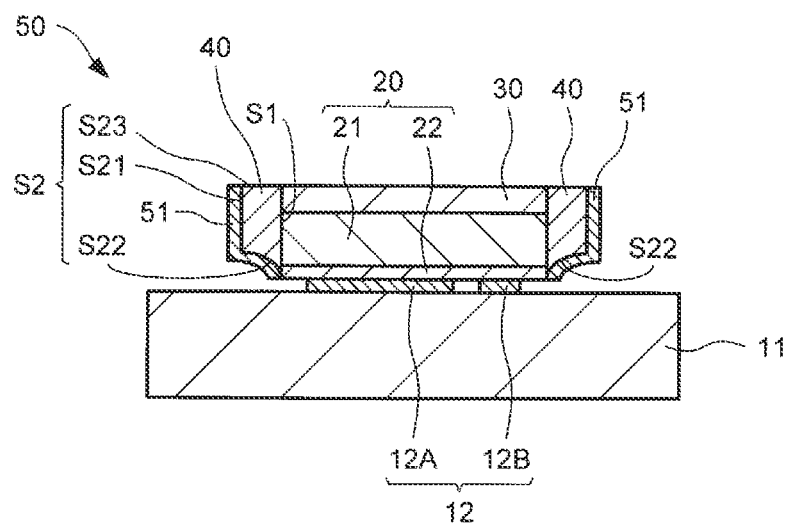
FIGS. 8A and 8B are a cross-sectional view and a top view, respectively illustrating a light-emitting device according to a second exemplary embodiment.
Figure 8B:
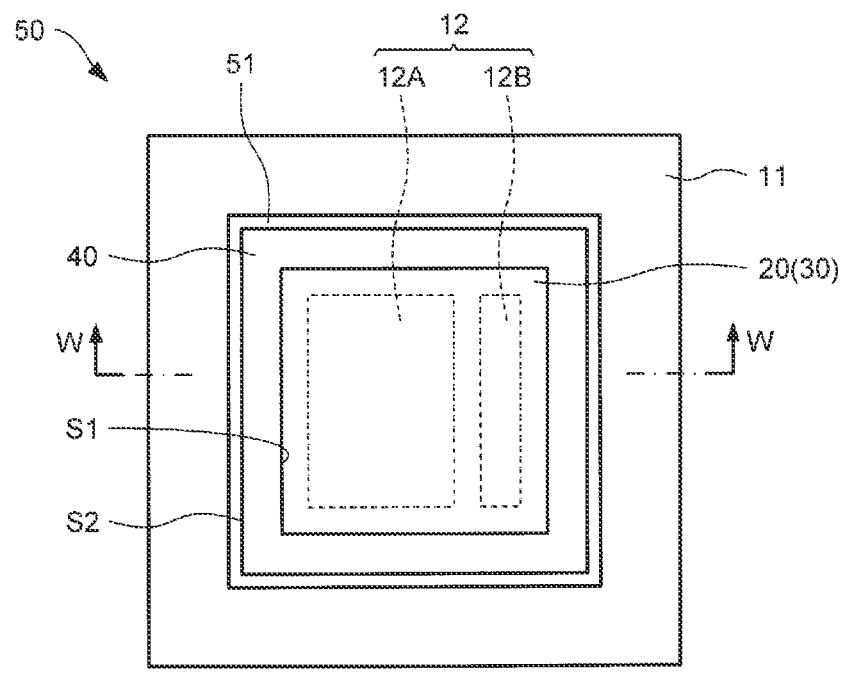

A description will next be given of a light-emitting device 50 according to the second exemplary embodiment with reference to FIGS. 8A and 8B. FIG. 8A is a cross-sectional view illustrating the light-emitting device 50, and FIG. 8B is a top view thereof. FIG. 8A is a cross-sectional view taken along line W-W of FIG. 8B.

The light-emitting device 50 has the same configuration as that of the light-emitting device 10 except that it has a reflective film 51 disposed on the outer exposed surface S2 of the resin body 40. The reflective film 51 is formed of a material having a reflectivity with respect to light emitted from the light-emitting element 20, and for example, formed of a metal material.

In this exemplary embodiment, the reflective film 51 is formed on the side surfaces S21 and the bottom surface S22 of the resin body 40. On the other hand, the reflective film 51 is not formed on the upper surface S23 of the resin body 40, so that the upper surface S23 of the resin body 40 is exposed to the outside. Therefore, the side surfaces of the light-emitting element 20 are surrounded by the resin body 40 and also the reflective film 51.

In this exemplary embodiment, the structure is suitable when it is intended that the light emitted from the light-emitting element 20 is reliably extracted from the light-transmitting plate 30 to the outside. For example, the reflectance of the light reflective resin as the resin body 40 is often lower than that of the metal material. Therefore, the light emitted from the light-emitting element 20 may not enter the light-transmitting plate 30 through the resin body 40. Further, when the light-transmitting resin is used to form the resin body 40, more light is emitted sideward of the resin body 40.

Here, in the case of a use application, such as a vehicular lamp, in which it is required to irradiate light only to a predetermined region, it is assumed that desired light distribution properties cannot be obtained only by the resin body 40, and other optical systems are complicated. Therefore, in consideration of obtaining high availability of desired light distribution properties (such as high light utilization efficiency and higher contrast), it is preferable that most of the light is extracted from the upper surface of the light-transmitting plate 30.

In contrast, in this exemplary embodiment, the light-emitting device 50 has the reflective film 51 on the side surfaces S21 and the bottom surface S22 of the resin body 40. Therefore, the light emitted from the light-emitting element 20, the light transmitted through the resin body 40, and the light reflected at the interface between the light-emitting element 20 and the light-transmitting plate 30 are reflected toward the light-transmitting plate 30 by the reflective film 51. Therefore, most of the light is extracted from the light-transmitting plate 30, and high capability of providing desired light distribution properties and light extraction efficiency can be obtained.

The reflective film 51 is also provided on the bottom surface S22 of the resin body 40, that is, the area with the concave-shaped surface. Therefore, there is a high possibility that the light reflected by the reflective film 51 on the bottom surface S22 travels toward the light-transmitting plate 30. Therefore, for example, attenuation of light due to reflection a plurality of times is suppressed, and there is a high possibility that the light having the intensity maintained reliably travels to the light-transmitting plate 30 and is taken out to the outside.

In this exemplary embodiment, the case where the reflective film 51 is provided on the bottom surface S22 of the resin body 40 has been described, but the configuration of the reflective film 51 is not limited to this. The reflective film 51 can be optionally provided on the bottom surface S22 of the resin body 40. That is, the reflective film 51 may be provided on part or all of the bottom surface S22 of the resin body 40, and may not be provided on the bottom surface S22.

For example, when the bonding layer 12 is formed of an electroconductive material serving also as an electrode and the reflective film 51 is formed of an electroconductive material, the bonding layer 12 and the reflective film 51 are separated from each other by not providing the reflective film 51 on the bottom surface S22 of the resin body 40. With this configuration, it is possible to prevent a short circuit from occurring between the electrodes due to proximity or contact between the bonding layer 12 and the reflective film 51.

Further, for example, the reflective film 51 may be formed only in the region on the bottom surface S22 of the resin body 40 near the side surface S21. In this case, the reflective film 51 is formed over a partial region of the bottom surface S22 from the side surface S21 of the resin body 40. In this case, it is possible to improve the reflectance at the bottom surface S22 and prevent short-circuiting between the electrodes due to proximity or contact between the bonding layer 12 and the reflective film 51.

Also, the reflective film 51 can be provided on the side surface S21 of the resin body 40 in an optional region according to the use application and purpose. For example, in the case where the layer thickness of the resin body 40, the length from the element contact surface S1 to the side surface S21 is large, even when the reflective film 51 is not formed on the side surface S21 and the reflective film 51 is provided only on the bottom surface S22, sufficient reflection characteristics and light extraction efficiency may be obtained in some cases.

In other words, the reflective film 51 may be provided at least in part on the side surface (outer peripheral side surface) S21 of the resin body 40, or may be provided at least in part on the bottom surface S22, or both. As a result, for example, optical characteristics meeting the requirements for various applications can be obtained.

In this exemplary embodiment, the reflective film 51 is not formed on the upper surface S23 of the resin body 40. As a result, the light having entered the resin body 40 is also extracted horn the upper surface S23 of the resin body 40. Therefore, for example, the entire inner side of the reflective film 51 can serve as a light extraction surface, so that a wide light extraction surface can be obtained in addition to high light extraction efficiency and capability of providing desired light distribution properties.

Note that the reflective film 51 is not hunted to the case of being formed of a metal material, and only need to be formed of a material having a reflectivity with respect to light emitted from the light-emitting element 20. For example, the reflective film 51 may be formed of a resin material with a focus on light reflectivity anchor a multilayer film thereof.

The reflective film 51 may be formed on the upper surface S23 of the resin body 40, for example, when the light-transmitting plate 30 contains a fluorescent material and the color mixing property thereof is given priority. As a result, the light is extracted only through the light-transmitting plate 30, so that the mixed light by means of the fluorescent material in the light-transmitting plate 30 is reliably extracted. Therefore, light having high color uniformity can be extracted.

As described above, in this exemplary embodiment, the light reflective film 51 is provided on at least a part of the side surface S21 or the bottom surface S22 of the resin body 40. Therefore, the light-emitting element 20 and the mounting substrate 11 can be reliably bonded to each other, and the light-emitting device 50 having high operation stability, light extraction efficiency, and capability of providing desired light distribution properties can be provided.

Figure 9A:
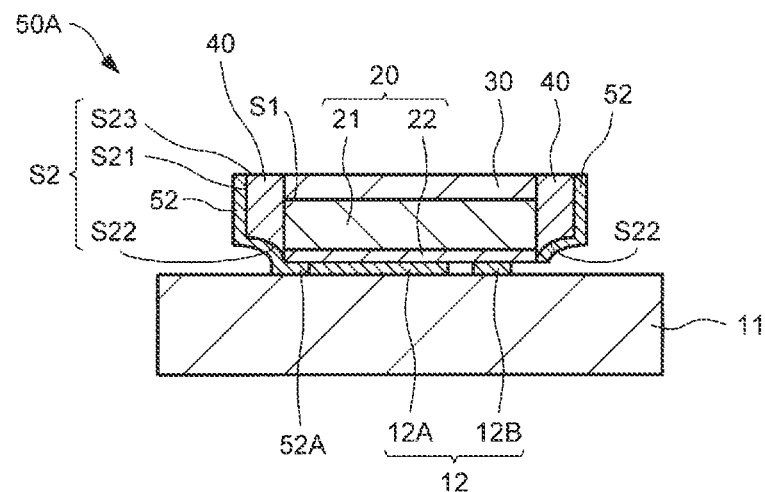
FIGS. 9A and 9B are a cross-sectional view and a top view, respectively illustrating a light-emitting device according to a modification of the second exemplary embodiment.
Figure 9B:
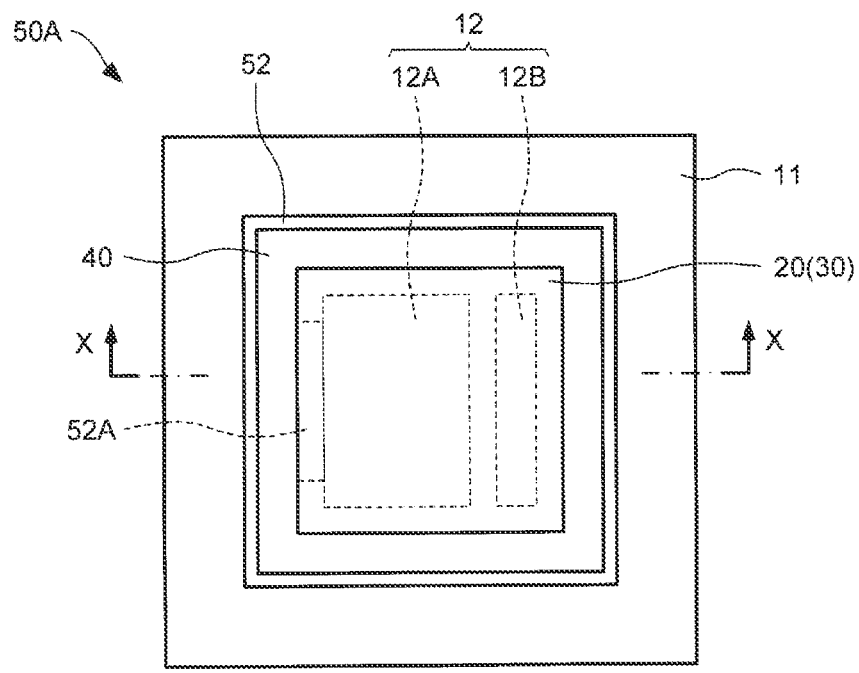

A description will next be given of several modifications hereinafter, and a light-emitting device 50A according to a modification of the second exemplary embodiment will be described with reference to FIGS. 9A and 9B. FIG. 9A is a cross-sectional view illustrating the light-emitting device 50A, and FIG. 9B is a top view illustrating the light-emitting device 50A. FIG. 9A is a cross-sectional view taken along line X-X of FIG. 9B.

The light-emitting device 50A has the same configuration as that of the light-emitting device 50 except for the configuration of the light reflective film 52. In this modification, the light reflective film 52 is connected to the first metal layer 12A of the bonding layer 12, that is, the cathode electrode of the light-emitting element 20.

In the present modification, the light reflective film 52 is connected to the first metal layer 12A between the light-emitting element 20 and the mounting substrate 11. More specifically, the light reflective film 52 has a connection portion 52A that extends on the light-emitting element 20 from the bottom surface S22 of the resin body 40 to the first metal layer 12A of the bonding layer 12 and is connected to the first metal layer 12A. For example, the light reflective film 52 has a configuration corresponding to the case where the connection portion 52A is added to the light reflective film 51.

Here, the light-emitting device 50A is a preferable configuration example when the bonding layer 12 also serves as an electrode for the light-emitting element 20 and the reflective film 52 is formed of a metal film. In the present modification, the bonding layer 12 is composed of the first and second metal layers 12A and 12B functioning as electrodes for the light-emitting element 20, and the reflective film 52 formed of a metal material is connected to the first metal layer 12A functioning as a cathode side electrode.

Therefore, when a voltage is applied to the light-emitting element 20, the reflective film 52 formed of metal is less susceptible to cationization due to application of a negative pressure. As a result, the reflective film 52 is hardly oxidized, which can suppress the binding of oxygen to the canonized metal. That is, it is possible to maintain a state in which the reflectance is high.

As described above, in the present modification, the reflective film 52 is connected to the first metal layer 12A functioning as the cathode electrode. Therefore, in the present modification, a potential on the low potential side, for example, a ground potential, is applied to the reflective film 52. Therefore, oxidation of the reflective film 52 described above is suppressed, so that the light-emitting device 50A operates stably even under various environments.

In other words, the light-emitting device 50A includes the bonding layer 12 that is present between the light-emitting element 20 and the mounting substrate 11 to bond the light-emitting element 20 and the mounting substrate 11 to each other. The bonding layer 12 includes the first metal layer 12A which forms a cathode electrode for the light-emitting element 20 and the second metal layer 12B which forms an anode electrode for the light-emitting element 20.

The reflective film 52 is formed of a metal film and is provided on the side surface S21 and the bottom surface S22 of the resin body 40. The reflective film 52 is connected to the first metal layer 12A between the light-emitting element 20 and the mounting substrate 11. Therefore, the light-emitting element 20 and the mounting substrate 11 can be reliably bonded to each other, so that the light-emitting device 50A having high operation stability, high light extraction efficiency and capability of providing desired light distribution properties can be provided.

Third Exemplary Embodiment

Figure 10A:
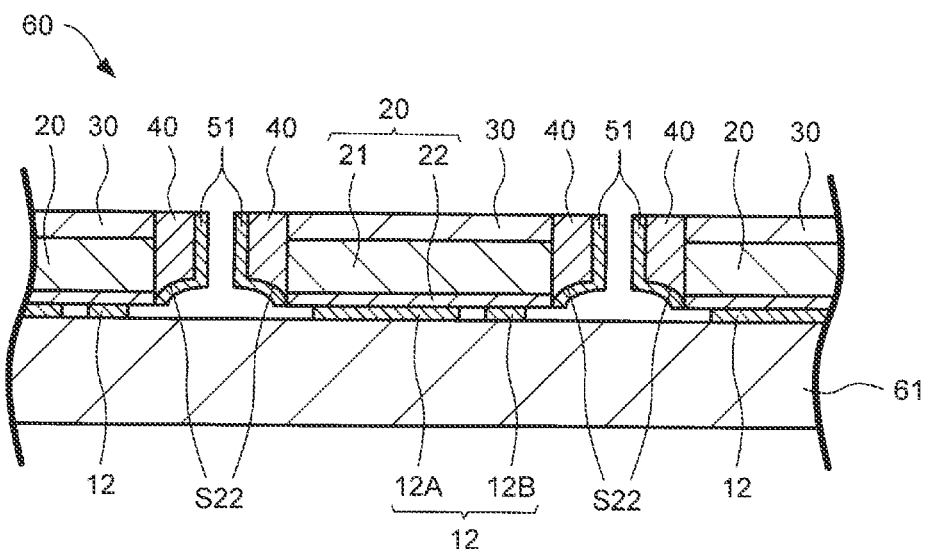
FIGS. 10A and 10B are a partial cross-sectional view and a top view, respectively, illustrating a light-emitting device according to a third exemplary embodiment.
Figure 10B:
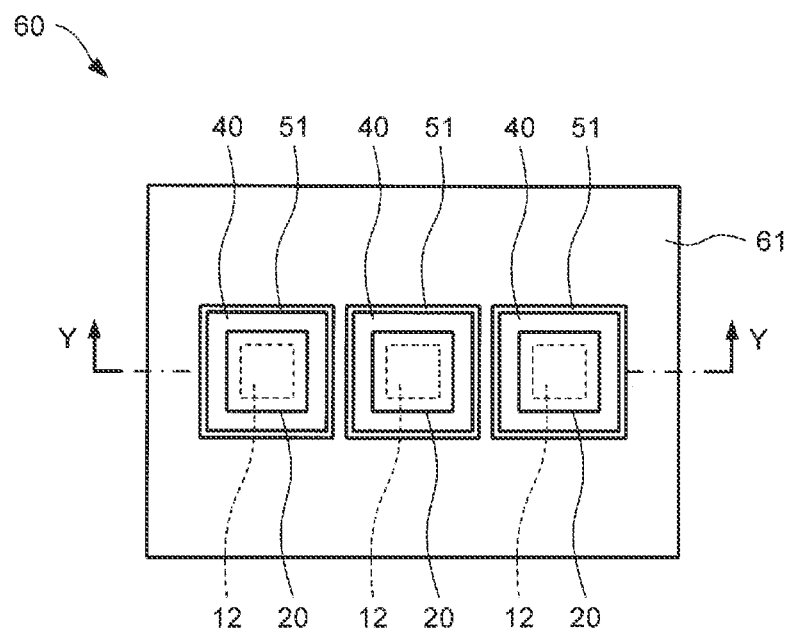

A description will now be given of another exemplary embodiment. FIG. 10A is a partial cross-sectional view illustrating a light-emitting device 60 according to a third exemplary embodiment, and FIG. 10B is a top view of the light-emitting device 60. FIG. 10A is a cross-sectional view taken along line Y-Y in FIG. 10B. The light-emitting device 60 will be described with reference to FIGS. 10A and 10B.

The light-emitting device 60 has the same configuration as that of the light-emitting device 50 according to the second exemplary embodiment, except that the light-emitting device 60 includes a plurality of light-emitting devices 20 juxtaposed on a mounting substrate 61, and a resin body 40 and a reflective film 51 provided in each of the light-emitting devices 20. In this exemplary embodiment, the light-emitting device 60 includes a mounting substrate 61 and three light-emitting elements 20 arranged in a line on the mounting substrate 61. In this exemplary embodiment, the light-emitting device 60 includes the light-transmitting plate 30 disposed on each of the light-emitting elements 20.

The light-emitting device 60 also includes a plurality of (three in this embodiment) resin bodies 40, each of which surrounds and covers side surfaces of each of the light-emitting elements 20 and which each have a concave-shaped bottom surface S22 that increases in distance from the mounting substrate 61 as it is separated away from each side surface of the light-emitting element 20 while facing the mounting substrate 61.

In this exemplary embodiment, each of the resin bodies 40 has an element contact surface S1 in contact with the light-emitting element 20 and an outer exposed surface S2 exposed to the outside. In addition, the resin body 40 has a side surface S21 forming an outer peripheral side surface, a bottom surface S22 facing the mounting substrate 11, and an upper surface S23 opposite to the bottom surface S22. A reflective film 51 is provided on the side surface S21 and the bottom surface S22 of each of the resin bodies 40.

In this exemplary embodiment, the light-emitting device 60 includes the plurality of light-emitting elements 20. For example, the light-emitting device 60 is configured such that the plurality of light-emitting elements 20 emit light in mutually different ranges being irradiated (light distribution ranges), and is used, for example, as a vehicular lamp. In this exemplary embodiment, the plurality of light-emitting elements 20 are configured to be turned on and off independently of each other. Therefore, the irradiation range being irradiated by the light-emitting device 60 changes in accordance with the combination of turning on and off of the respective light-emitting elements 20.

In the light-emitting device 60, it is not preferable that the irradiation range corresponding to the light-emitting element 20 being turned off (in a non-conductive state) is irradiated by the light from the light-emitting element 20 being turned on (in a conductive state), that is, it is not preferable that so-called crosstalk of light occurs.

To cope with this problem, in this exemplary embodiment, the side surfaces of the plurality of light-emitting elements 20 are covered with the resin body 40 and the reflective film 51. Therefore, the light-emitting device 60 can suppress the occurrence of crosstalk and have high light extraction efficiency and capability of providing desired light distribution properties.

Note that the light-transmitting plate 30 may contain a fluorescent material. The light-emitting device 60 can be configured as a light-emitting device capable of emitting white light due to the provision of the light-transmitting plate 30 containing a fluorescent material on each of the light-emitting elements 20. Also in this case, since the resin body 40 surrounds and covers the side surfaces of the light-emitting element 20 and the light-transmitting plate 30, good bonding property and high light extraction efficiency can be obtained. Nevertheless, the light-emitting device 60 may not include the light-transmitting plate 30.

Further, a reflective film 52 may be provided instead of the reflective film 51. The light-transmitting plate 30 and the reflective film 51 may not be provided. In place of each of the light-emitting elements 20, the light-emitting element 20A or 20B may be provided. The bonding layer 12 does not need to function as an electrode for the light-emitting element 20. Further, the resin body 40 may have a bottom surface S24 having a planar shape or a bottom surface S25 having a convex shape instead of the bottom surface S22 having a concave shape.

As described above, in this exemplary embodiment, the light-emitting device 60 includes the mounting substrate (substrate) 61, the plurality of light-emitting elements 20 disposed on the mounting substrate 61 with the bonding layer 12 interposed therebetween, and the resin body 40 that surrounds and covers the side surfaces of each of the plurality of light-emitting elements 20. Each of the resin bodies 40 has a bottom surface S22, S24, or S25 having a curved surface shape or a planar shape in which the distance from the mounting substrate 61 increases in a direction away from each side surface of the light-emitting element 20 while facing the mounting substrate 61. Therefore, the light-emitting element 20 and the mounting substrate 61 can be reliably bonded to each other, so that the light-emitting device 60 having high operation stability, high light extraction efficiency, and capability of providing desired light distribution properties can be provided.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light-emitting device comprising:
a substrate;
a light-emitting element disposed on the substrate with a bonding layer interposed therebetween;
a resin body configured to surround and cover entire side surfaces of the light-emitting element, and have a bottom surface having any of a curved surface shape and a planar surface shape that faces the substrate and is configured so that the distance between the resin body and the substrate increases as a distance from the side surface of the light-emitting element increases; and
a reflective film disposed on an outer peripheral side surface of the resin body.

2. The light-emitting device according to claim 1, wherein the reflective film is also disposed on at least part of the bottom surface of the resin body.

3. The light-emitting device according to claim 2, wherein the resin body is formed of a resin material having a reflectivity with respect to light emitted from the light-emitting element.

4. The light-emitting device according to claim 2, further comprising a light-transmitting plate that contains a fluorescent material and is disposed over the light-emitting element, the resin body surrounding and covering also a side surface of the light-transmitting plate.

5. The light-emitting device according to claim 1, wherein the resin body is formed of a resin material having a reflectivity with respect to light emitted from the light-emitting element.

6. The light-emitting device according to claim 1, further comprising a light-transmitting plate that contains a fluorescent material and is disposed over the light-emitting element, the resin body surrounding and covering also a side surface of the light-transmitting plate.

7. The light-emitting device according to claim 1, wherein a plurality of sets, each including the light-emitting element, the resin body, and the reflective film, are arranged on the substrate in a line.

8. The light-emitting device according to claim 7, wherein the light-emitting device is for use in a vehicular lamp.

9. The light-emitting device according to claim 7, wherein the plurality of sets each including the light-emitting element, the resin body, and the reflective film are configured to be turned on and off independently of each other.

10. A light-emitting device comprising:
a substrate;
a light-emitting element disposed on the substrate with a bonding layer interposed therebetween; and
a resin body configured to surround and cover entire side surfaces of the light-emitting element, and have a bottom surface having any of a curved surface shape and a planar surface shape that faces the substrate and is configured so that the distance between the resin body and the substrate increases as a distance from the side surface of the light-emitting element increases, wherein
the resin body is formed of a resin material having a reflectivity with respect to light emitted from the light-emitting element.

11. The light-emitting device according to claim 10, further comprising a light-transmitting plate that contains a fluorescent material and is disposed over the light-emitting element, the resin body surrounding and covering also a side surface of the light-transmitting plate.

12. The light-emitting device according to claim 10, wherein a plurality of sets, each including the light-emitting element and the resin body, are arranged on the substrate in a line.

13. The light-emitting device according to claim 12, wherein the light-emitting device is for use in a vehicular lamp.

14. The light-emitting device according to claim 12, wherein the plurality of sets each including the light-emitting element and the resin body are configured to be turned on and off independently of each other.

15. A light-emitting device comprising:
a substrate;
a light-emitting element disposed on the substrate with a bonding layer interposed therebetween;
a resin body configured to surround and cover entire side surfaces of the light-emitting element, and have a bottom surface having any of a curved surface shape and a planar surface shape that faces the substrate and is configured so that the distance between the resin body and the substrate increases as a distance from the side surface of the light-emitting element increases; and
a reflective film disposed on at least part of the bottom surface of the resin body, wherein
the resin body is formed of a resin material having a reflectivity with respect to light emitted from the light-emitting element.

16. The light-emitting device according to claim 15, wherein
the bonding layer includes a first metal layer serving as a cathode electrode for the light-emitting element and a second metal layer serving as an anode electrode for the light-emitting element,
the reflective film is formed of a metal film and disposed on an outer peripheral side surface and the bottom surface of the resin body, and
the reflective film is connected to the first metal layer in between the substrate and the light-emitting element.

17. The light-emitting device according to claim 15, further comprising a light-transmitting plate that contains a fluorescent material and is disposed over the light-emitting element, the resin body surrounding and covering also a side surface of the light-transmitting plate.

18. A light-emitting device comprising:
a substrate;
a light-emitting element disposed on the substrate with a bonding layer interposed therebetween;
a resin body configured to surround and cover entire side surfaces of the light-emitting element, and have a bottom surface having any of a curved surface shape and a planar surface shape that faces the substrate and is configured so that the distance between the resin body and the substrate increases as a distance from the side surface of the light-emitting element increases; and
a light-transmitting plate that contains a fluorescent material and is disposed over the light-emitting element, the resin body surrounding and covering also a side surface of the light-transmitting plate.

19. The light-emitting device according to claim 18, wherein a plurality of sets, each including the light-emitting element, the resin body, and the light-transmitting plate, are arranged on the substrate in a line.

20. The light-emitting device according to claim 19, wherein the light-emitting device is for use in a vehicular lamp.

21. The light-emitting device according to claim 19, wherein the plurality of sets each including the light-emitting element, the resin body, and the light-transmitting plate are configured to be turned on and off independently of each other.

* * * * *